United States Patent

[11] 3,584,236

[72] Inventor Roger S. Greatrex
London, England
[21] Appl. No. 784,306
[22] Filed Dec. 17, 1968
[45] Patented June 8, 1971
[73] Assignee Westinghouse Brake and Signal Company, Limited
London, England
[32] Priority Dec. 21, 1967
[33] Great Britain
[31] 58,057/67

[54] FAIL-SAFE TRANSISTOR GATE CIRCUIT
9 Claims, 1 Drawing Fig.

[52] U.S. Cl. .......... 307/255, 307/253, 307/249
[51] Int. Cl. .......... H03b 17/00
[50] Field of Search .......... 307/249, 250, 253, 254, 255, 288, 313

[56] References Cited
UNITED STATES PATENTS

| | | | |
|---|---|---|---|
| 2,907,895 | 10/1959 | Van Overbeek .......... | 307/288 |
| 2,970,227 | 1/1961 | Horton et al. .......... | 307/254X |
| 2,992,409 | 7/1961 | Lawrence, Jr. .......... | 307/254X |

*Primary Examiner*—Donald D. Forrer
*Assistant Examiner*—B. P. Davis
*Attorneys*—W. L. Stout and John B. Sotak

ABSTRACT: This disclosure relates to a fail-safe solid-state electronic logic circuit employing a pair of opposite conductivity types of transistor amplifiers. The transistor amplifiers are coupled in tandem and produce an AC output when and only when an AC input is present, the biasing voltage and ground connection of each amplifier is "true" and a critical circuit failure is absent.

PATENTED JUN 8 1971 3,584,236
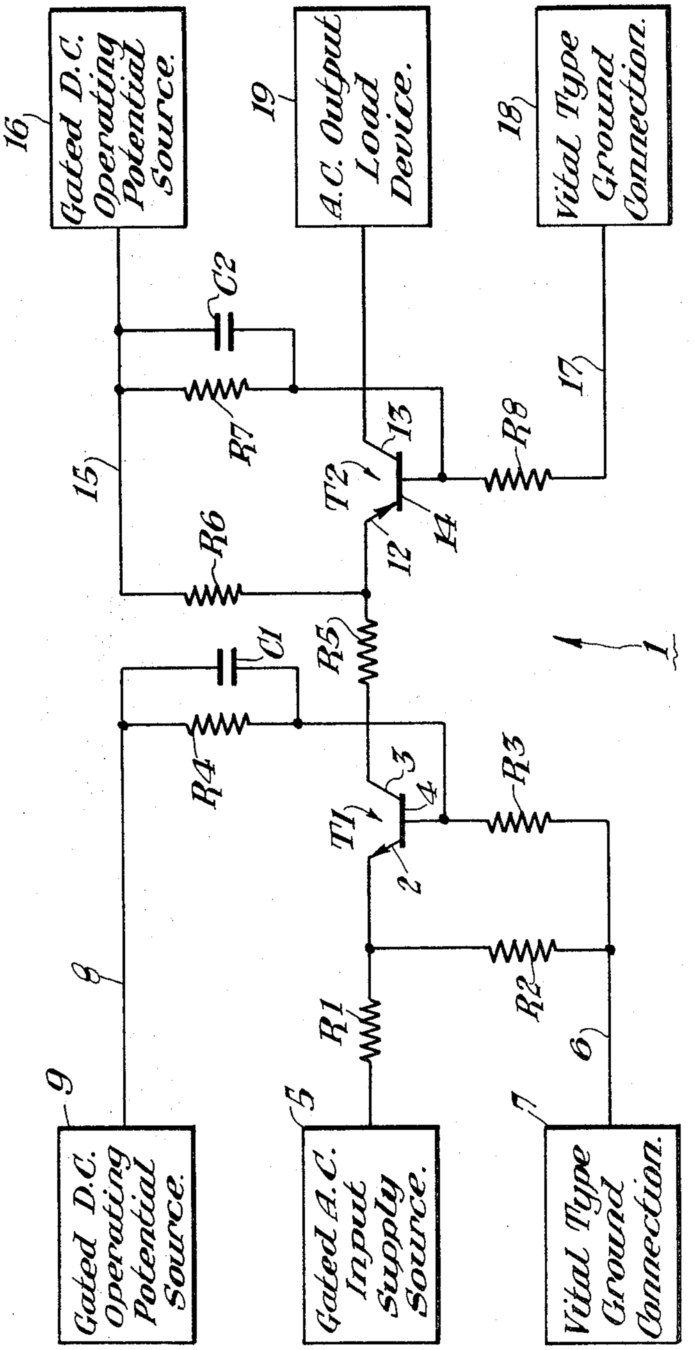
INVENTOR
Roger S. Greatrex.
HIS ATTORNEY

FAIL-SAFE TRANSISTOR GATE CIRCUIT

This invention relates to solid-state logic circuits and more particularly to static fail-safe gates which employ a plurality of cascaded complementary transistor stages.

While numerous types of static logic circuits are well known in the art, as a rule these conventional logic circuits are possessed of certain disadvantages which make their direct application to vital signaling and control systems generally unacceptable and intolerable. For example, in certain applications, such as signaling and control systems for railway and/or mass and rapid transit operations, the substitution and utilization of static gating circuits in place of relay gating circuits greatly reduces the various shortcomings normally accompanying the previous types of systems employing electromechanical devices. However, it will be appreciated that in such signaling and control applications, it is of utmost importance to positively ensure that the static gates operate in a fail-safe manner, that is, in case of any malfunction or probable component failure, the most restrictive type of condition must prevail in order to satisfy the security standards and safety requirements of the administrative authorities. This need arises not only from the fact that failures could generally result in costly damage to the operating equipment but also from the reality that malfunctions could equally cause injury and possibly death to individuals, such as passengers and employees.

Accordingly, it is an object of this invention to provide a new and improved static logic circuit which operates in a fail-safe manner.

A further object of this invention is to provide a fail-safe logic circuit employing a pair of cascaded common-base amplifiers.

Another object of this invention is to provide a fail-safe logic circuit having a pair of cascaded gates utilizing complementary transistors.

Yet a further object of this invention is to provide a new and improved solid-state gating circuit which employs a plurality of common-base amplifier stages each having a current gain less than unity.

Yet another object of this invention is to provide a fail-safe solid-state electronic gate employing a plurality of NPN and PNP transistors.

Still a further object of this invention is to provide a fail-safe multistage static logic circuit which produces an output depending upon the state of plurality of inputs.

Still another object of this invention is to provide a multistage transistorized gating circuit which produces an output signal only when a plurality of input are "true" and in the absence of a critical circuit failure.

Still yet a further object of this invention is to provide a fail-safe logic circuit which is economical in cost, simple in construction, reliable in operation, durable in use and efficient in service.

Briefly, the present invention comprises a two-stage semiconductor type of fail-safe static logic circuit. The first stage includes an NPN transistor which is connected in common-base arrangement so that the current gain is less than unity. The base electrode is connected to a voltage divider network supplied by a controllable DC input so that a relatively constant bias voltage is applied to the base electrode. A vital type of grounded potential reference point is resistively connected to the emitter electrode of the NPN transistor. The emitter electrode of the NPN transistor is also connected by a current-limiting resistor to an input source of periodically varying signals to be gated. The collector electrode of the NPN transistor constitutes the output of the first stage and is connected to the input of the second stage of the logic circuit. The second stage of the logic circuit includes a PNP transistor having an emitter, collector and base electrodes. The emitter electrode of the PNP transistor is connected to the collector electrode of the NPN transistor by a resistor which limits the amount of output current fed to the second stage. The emitter bias voltage is applied by a resistor connected to a positive DC input potential source which is gate controlled. The base bias voltage is supplied by a voltage divider which is connected between a gated positive potential source and a vital type of grounded potential reference point. An AC output is derived from the collector electrode of the PNP transistor when and only when both the AC and DC inputs to both stages are "-true", the grounded reference points are intact and barring a critical circuit failure.

The above objects and other attendant features and advantages of the invention and a better understanding of its operation will become more fully evident from the following detailed description when considered in connection with the accompanying drawing wherein:

The single FIGURE in the drawing is a schematic circuit diagram illustrating a preferred embodiment of the present invention.

The present invention has evolved with the general object of providing a unique fail-safe static logic circuit which overcomes the disadvantages of previously known logic circuits irrespective of their use or application. However, it will be appreciated that in order to maintain the necessary integrity and security in a vital type of system, such as for example, a railway signaling and control system, it is mandatory that each critical portion or section which makes up the overall system must operate in a fail-safe manner. Accordingly, it is understood that the associated apparatus, such as the input source and output device, accompanying the present logic circuit, are also vital types of circuits which operate in a fail-safe manner. With this in mind, it will be seen that the static logic circuit embodying the present invention will produce an output when and only when the the inputs are "true" and in the absence of a critical circuit malfunction. As applied herein, the term "true" defines a logical assertion, namely, that the prescribed input or output is present or that the input or output is gated on or at the level for which the circuit was designed. Further, the term "false", as used hereinafter, is defined as a logical negation, namely, that the prescribed input is absent or that the prescribed input or output is gated off or not at the level for which the circuit was designed.

Referring to the drawing, there is shown a unique fail-safe solid-state static logic circuit generally characterized by numeral 1 comprising a pair of cascaded amplifier gates employing complementary transistors. As shown, the first stage of the logic circuit includes an NPN transistor T1 connected in a common-base amplifier configuration so that the current gain is slightly less than unity. The transistor T1 includes an emitter electrode 2, a collector electrode 3, and a base electrode 4. The input emitter electrode 2 of transistor T1 is connected by a carbon composition type of current-limiting resistor R1 to a controllable AC supply source 5 which may be selectively gated to provide suitable AC input signals. The emitter electrode 2 of transistor T1 is also connected by a biasing resistor R2 to a ground conductor or lead 6. As shown, the lead 6 is coupled to a vital type ground connection 7 such as, a four terminal bus arrangement which has two separate leads connected from the common bus to lead 6 as well as two separate leads connected from the common bus to a reference point such as, a ground line, thereby ensuring that a DC input reference point will not be disconnected from the first stage due to the loss of a single lead connection from either lead 6 or the ground line. The DC bias voltage of the common-base electrode 4 of the transistor T1 is kept relatively constant by a voltage divider network comprising a pair of series connected resistors R3 and R4. As shown, the base electrode 4 is connected by the resistor R3 to the ground conductor or lead 6. The base electrode is also connected by a resistor R4 to a voltage supply conductor or lead 8 which in turn is connected to a suitable controllable input source of positive DC operating potential. The DC input potential source 9 is preferably a gated type of fail-safe transformer-diode detector circuit. A bypass capacitor C1 is connected from ground supply lead 8 to the junction point of the voltage divider network which maintains a substantially constant voltage on the base electrode 4.

The output is taken from collector electrode 3 of first stage transistor T1 by means of a resistor R5 which is coupled to the input of the second logic stage having a PNP transistor T2. The transistor T2 includes an emitter electrode 12, a collector electrode 13 and a base electrode 14 also arranged as a common-base amplifier. As mentioned above, the input emitter electrode 12 of transistor T2 is connected by a carbon composition type of current-limiting resistor R5 to the output collector electrode 3 of transistor T1 and is also connected by a biasing resistor R6 to a voltage supply conductor or lead 15 which in turn is connected to a suitable controllable source 16 of positive DC input operating potential, similar to source 9. The base bias potential is supplied by a voltage divider network comprising a pair of series connected resistors R7 and R8 which provide a relatively fixed supply voltage at the common base electrode 14 of the transistor T2. As shown, the base electrode 14 of transistor T2 is connected to supply lead 15 by a resistor R7. A bypass capacitor C2 is coupled in parallel with resistor R7. It will be appreciated that the capacitors C1 and C2 may be connected from the base electrodes of transistors T1 and T2 to the ground leads 6 and 17, respectively, or may in some cases be omitted if desired. The base electrode 14 is also connected by a resistor R8 to a ground conductor or lead 17 which is connected to a suitable vital type of ground connection 18 which maintains a DC reference point to the second stage and is similar to the four-terminal connection 7. The AC output signals which are derived from the collector electrode 13 are directly connected to a suitable AC output load device 19, such as, a subsequent gate circuit or some other vital type of device.

In describing the operation of the logic circuit embodying this invention, it will be initially assumed that the circuit is operating properly and that the circuit is producing a logical assertion or a "true" indication on the output collector electrode 13. That is, in order to pass the periodically varying input signals from supply source 5 to load device 19, potential leads 8 and 15 are required to be at a predetermined positive supply level while the leads 6 and 17 are necessarily held at ground level.

Let us assume that the operating point of each transistor is located on the linear portion of the dynamic transfer characteristic curve so that each amplifier stage is operating linearly, and therefore, the derived output signals are a reproduction or a direct replica of the applied input signals. With the AC input signal source 5 "true", the biasing potential source 9 "true" and the ground monitoring device 7 "true", the AC signals applied via resistor R1 will appear on the collector electrode 3 of the transistor T1. Accordingly, the first stage of the logic circuit 1 is "true,", and therefore, the appearance of AC output signals on collector electrode 3 will represent a logical assertion signifying that that the AC input, biasing and ground conditions are "true". The AC signals produced on collector electrode 3 of transistor T1 are applied via resistor R5 to the emitter electrode 12 of transistor T2 so that the AC input to the second stage of logic circuit 1 is "true" at this time. If the DC biasing potential source 16 and the ground monitoring device 18 are "true", the necessary biasing and ground connection are present so that AC output signals will appear on the collector electrode 13 of transistor T2 to energize the load device 19. Accordingly, with the load device energized, the logic circuit 1 is in a "true" condition, namely, a logical assertion which represents the most restrictive of two possible conditions and signifies that the AC input, the biasing and the ground conditions on each stage are "true." That is, it is to be understood that when AC current flows through the load device 19, a predetermined value of positive biasing voltage is applied to both leads 8 and 15, the leads 6 and 17 are grounded and AC input signals are applied to the emitter electrode 2 and in turn to emitter electrode 12 and a critical circuit failure is absent.

It is readily apparent that the removal of the positive DC operating potential from the leads 8 and/or 15, such as, by gating off the potential sources 9 and 16, respectively, causes the base drives of the respective transistors to disappear so that the transistors cease to conduct. The transistors T1 and T2 will also turn off when either of the reference conductors 6 or 17 become disconnected or when either of the reference conductors is subjected to the appearance of a positive DC potential. Obviously, the removal of the AC input signals either by intentional gating off of the source 5 or by an open circuit failure of the resistor R1 causes the AC output signals on the collector electrode 3 and, in turn, on the collector electrode 13 to disappear so that the load device will become deenergized or "false." As previously mentioned, the resistors R1 and R5 are constructed of carbon composition so that the chance of these resistors shorting is highly improbable if not impossible. The short circuiting of the remaining resistors or bypass capacitors either causes the given amplifier stage to be turned off, driven in heavy saturation or results in the AC signals to be shorted to ground each of which prevents the generation of a logical assertion. In a like manner, the open circuiting of the resistors, namely, resistors R2, R3, R4, R6, R7, R8 as well as resistors R1 and R5 causes the loss of either the necessary biasing potentials or the AC input signals, both of which destroy the capability of the circuit to produce an output signal during such conditions of failures.

It will be appreciated that since a common-base amplifier configuration has a current gain less than unity, the amount of current derived from the collector electrode 3 is slightly less than the current applied to emitter electrode 2 from source 5. Similarly, the AC current level taken from the collector electrode 13 of transistor T2 is slightly less than the amount of current flowing into emitter electrode 12. Therefore, in the signal passing mode of operation, the logic circuit produces AC current output having an amplitude which is a direct function of the gain of each transistor stage. This unique characteristic of a common-base amplifier is highly advantageous in providing fail-safeness in the present logic circuit since an active component failure, such as, a short circuit condition existing between the emitter and collector electrodes, is not capable of producing a "true" condition or a logical assertion for energizing the load device 19. For example, let us assume that either or both of the conductors 6 and 8 are "false" or not at the conditions for which the circuit was designed, namely, that a positive potential is not on lead 8 and the conductor 6 is not at ground level, but that AC input signals are being delivered to the emitter electrode 2 of transistor T1 and that a short occurs between the emitter and collector electrodes 2 and 3 respectively. It will be seen that AC is permitted to flow from the source 5 through resistor R1, through the short circuited emitter-collector electrodes 2, 3 and through the resistor R5 to the emitter electrode 12 of transistor T2. However, the impedance values of resistors R1 and R5 are selected so that their cumulative effect sufficiently reduces the level of current flowing to the emitter electrode 12 to prevent any appreciable signal from being produced on the output collector electrode 13. That is, with less than full input current flowing to transistor T2 little, if any, output current is available at the collector electrode 13 for energizing the load device 19. Similarly, the short circuit of the emitter-collectors electrodes 12, 13 of the transistor T2 causes a sufficient reduction in the output current to prevent the load device 19 from being energized. It is quite apparent that an open circuited condition in either transistor stage destroys the integrity of the circuit so that a logical assertion or an AC output is not capable of being produced during such failures.

Thus, it is readily evident that a critical circuit failure of either an active or passive element of either stage is incapable of erroneously producing a simulated logical assertion or an output for energizing load device 19, and therefore, the logic circuit operates in a fail-safe manner.

It will also be appreciated that in the actual physical circuit layout and wiring, the designer and wireman should exercise extreme care and caution in order to ensure that unrelated wires are highly unlikely to become crossed or shorted.

From the foregoing, it can be seen that the presently described fail-safe logic circuit lends itself to many applications other than signaling and control systems where security and integrity of a system are of paramount importance in maintaining vital functions.

While it will be noted that the first stage of the logic circuits employs an NPN transistor and the second stage employs a PNP transistor, it is understood by those skilled in the art that the transistor of each stage may be of an opposite conductivity type with merely a reversal in the voltage polarities. Further, it will be appreciated that the amplifiers are not restricted to class A operation but that other classes of amplifiers may be employed where suitable precautions are taken to discern between input and noise signals or when signal distortion is of no consequence.

Other changes and uses within the spirit and scope of this present invention will become more readily apparent to others who are skilled in the art.

Having thus described my invention, what I claim is:

1. A fail-safe logic circuit comprising a solid-state electronic gate, said solid-state electronic gate including a first and a second transistor each having an emitter, a collector and a base electrode, a gated source of AC input signals selectively connected to said emitter electrode of said first transistor, a first gated source of DC potential selectively connected to said base electrode of said first transistor, a first ground connection coupled to said emitter and base electrodes of said first transistor, said collector electrode of said first transistor coupled to the emitter of said second transistor, a second gated source of DC potential selectively coupled to said base electrode of said second transistor, and second ground connection coupled to said emitter and base electrodes of said second transistor wherein AC output signals are present on the collector electrode of said second transistor when and only when said source of AC input signals and said sources of DC biasing potentials are gated on, said ground connection is intact and a critical circuit failure is absent.

2. A fail-safe logic circuit as defined in claim 1 wherein, said first transistor is of an NPN type.

3. A fail-safe logic circuit as defined in claim 1, wherein a voltage divider network including a first and a second resistor connects said source of DC potential to said base electrode of said first transistor.

4. A fail-safe logic circuit as defined in claim 3, wherein a bypass capacitor is connected across said first resistor.

5. A fail-safe logic circuit as defined in claim 1, wherein a current-limiting resistor connects said source of AC input signals to said emitter electrode of said first transistor.

6. A fail-safe logic circuit as defined in claim 1, wherein a biasing resistor is coupled between said emitter electrode of said transistor and said first ground connection.

7. A fail-safe logic circuit comprising a pair of cascaded complementary transistor amplifiers, each of said transistor amplifiers having an input, an output and a common electrode, a source of AC input signals coupled to the input electrode of one of said complementary transistor amplifiers, a first source of DC biasing potential coupled to said common electrode of said one complementary transistor, a first ground connection coupled to said input and common electrodes of said one complementary transistor, said output electrode of said one complementary transistor coupled to the input electrode of the other of said complementary transistors, a second source of DC biasing potential coupled to said common and said input electrodes of said other complementary transistor, a second ground connection coupled to said common electrode of said other complementary transistor, a load device coupled to said output electrode of said other complementary transistor and being energized when and only when said AC input signals and said first and said second DC biasing potentials are present, said first and second ground connections are intact and barring a critical circuit failure.

8. A fail-safe logic circuit as defined in claim 7, wherein each of said transistor amplifiers are connected in a common-base configuration.

9. An electronic gating circuit comprising in combination, first and second transistors of the opposite conductivity type with each having an emitter, a collector and a base electrode, a first voltage divider network including a first and a second resistor and a capacitor bypassing said first resistor for providing a substantially constant biasing potential on said base electrode of said first transistor, a first current-limiting resistor for applying AC input signals to said emitter electrode of said first transistor, a first biasing resistor for connecting said emitter electrode of said first transistor to a reference potential, a second voltage divider network including a first and a second resistor and a capacitor bypassing said first resistor for providing a substantially constant biasing potential on said base electrode of said second transistor, a second biasing resistor for providing emitter biasing potential on said emitter electrode of said second transistor, a second current-limiting resistor coupling said collector electrode of said first transistor to the emitter electrode of said second transistor, and means for deriving AC output signals from said collector electrode of said second transistor when the biasing potentials are at a predetermined level and the AC input signals are present and a critical circuit failure is absent.